United States Patent
Göring et al.

(10) Patent No.: US 6,683,727 B1
(45) Date of Patent: Jan. 27, 2004

(54) OPTICAL ARRANGEMENT FOR SYMMETRIZING THE RADIATION OF TWO-DIMENSIONAL ARRAYS OF LASER DIODES

(75) Inventors: Rolf Göring, Jena (DE); Torsten Possner, Jena (DE); Peter Schreiber, Jena (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/926,076

(22) PCT Filed: Mar. 28, 2000

(86) PCT No.: PCT/EP00/02708

§ 371 (c)(1),
(2), (4) Date: Aug. 24, 2001

(87) PCT Pub. No.: WO00/60399

PCT Pub. Date: Oct. 12, 2000

(30) Foreign Application Priority Data

Mar. 31, 1999 (DE) .......................... 199 14 755

(51) Int. Cl.[7] ........................... G02B 27/12; G02B 27/10
(52) U.S. Cl. ..................... 359/639; 359/623; 359/626
(58) Field of Search .......................... 359/639, 623, 359/626, 627, 710

(56) References Cited

U.S. PATENT DOCUMENTS

| | | | | |
|---|---|---|---|---|
| 5,633,695 A | * | 5/1997 | Feke et al. | 351/221 |
| 5,808,803 A | | 9/1998 | Ullmann et al. | 359/641 |
| 5,887,096 A | | 3/1999 | Du et al. | 385/39 |
| 6,151,168 A | * | 11/2000 | Goering et al. | 359/623 |
| 6,337,873 B1 | * | 1/2002 | Goering et al. | 372/69 |

FOREIGN PATENT DOCUMENTS

| | | |
|---|---|---|
| DE | 4438368 | 5/1996 |
| DE | 19500513 | 7/1996 |
| DE | 19544488 | 6/1997 |
| DE | 19645150 | 5/1998 |
| DE | PCT/EP00/02708 | * 3/2000 ........... G02B/27/09 |
| EP | 1166165 | 1/2002 |
| WO | 96/21877 | 7/1996 |

OTHER PUBLICATIONS

Rolf Göring et al., "Microoptical Beam Transformation System for High Power Laser Diode Bars with Efficient Brightness Conservation", SPIE, vol. 3008, pp. 202–210 (1997).

* cited by examiner

Primary Examiner—Georgia Epps
Assistant Examiner—Brandi Thomas
(74) Attorney, Agent, or Firm—Greenblum & Bernstein, P.L.C.

(57) ABSTRACT

An optical arrangement for symmetrizing beams which includes a plurality of laser diodes arranged next to one another. The plurality of laser diodes emit beams which are asymmetrical relative to a first direction and a second direction, with the second direction being perpendicular to the first direction. A microcylinder lens optics is arranged in an inclined manner around an optical axis. The beams emitted by the laser diodes in the first direction are collimated and deflected at different angles and are separated thereby. A direction element is arranged downstream of the microcylinder lens optics. The direction element deflects a beam of each individual laser diode in the second direction, whereby each of these beams is deflected by a different angle in the second direction, in such a way that central points of the individual beams converge at a predetermined distance in the second direction. The direction element deflects a beam of the individual laser diode in the first direction in such a way that each of these beams converges at a predetermined distance in the first direction. A redirection element is arranged at a predetermined distance downstream of the direction element. The redirection element compensates for different angles of deflection of the beams which are transmitted through the direction element in a plane.

38 Claims, 2 Drawing Sheets

OPTICAL ARRANGEMENT FOR SYMMETRIZING THE RADIATION OF TWO-DIMENSIONAL ARRAYS OF LASER DIODES

CROSS-REFERENCE TO RELATED APPLICATIONS

The present application is a National Stage Application of International Application No. PCT/EP00/02708, filed Mar. 28, 2000. Further, the present application claims priority, under 35 U.S.C. §119, of German Patent Application No. 199 14 755.8 filed on Mar. 31, 1999.

BACKGROUND OF THE INVENTION

1. Field of the Invention

The invention relates to an optical arrangement for symmetrizing the beams from laser diodes.

2. Discussion of Background Information

For the production of high-power laser diode arrangements, a plurality of laser diodes are arranged next to one another in a fixed orientation relative to so-called laser diode bars. Such bars achieve optical output of up to approximately 40W and comprise individual emitters arranged in a row with typical dimensions of the radiating surface from 50 $\mu$m×1 $\mu$m to 200 $\mu$m×1 $\mu$m, with the linear arrangement of these emitters always occurring in the direction of their greatest expansion. In order to achieve even greater outputs, such laser diode bars are stacked on top of one another in the direction of the smaller extension of the emitters into laser diode stacks. The emission of these stacks is extremely asymmetrical and has a low radiance due to the non-radiating regions between the individual emitters of a bar and among the bars as compared to the individual emitters.

In order to achieve a symmetrical bundle with the greatest possible radiance as is needed, for example, for material processing or for pumping of solid state lasers, optical systems are necessary that, on the one hand, cause a symmetrizing of the beams as well as a fading-out of the non-radiating regions for the purpose of maintaining the radiance.

Arrangements for symmetrizing laser diode stacks are known, for example, for connection to optical fibers and/or focusing in a focal spot. Here, depending on the requirements with regard to symmetrizing and radiance, different concepts are prior art.

The coupling of a stack is described in DE 195 00 513 C1. Here, it is disadvantageous that the minimum distance between the individual bars is three times the thickness of the collimation lenses, which may obstruct the integration of as great as possible a number of bars for a given height.

While an arrangement according to DE 195 44 488 does allow a scaling to very high outputs by using many bars, the radiance achieved is at least one order of magnitude less than the fiber-coupled laser diode bars, such as those according to DE 44 38 368.

Moreover, an optical arrangement of multiple laser diodes arranged next to one another in a fixed allocation for symmetrizing of beams is known (DE 196 45 150 A1). The symmetrizing arrangement here comprises a cylinder lens rotated around the optical axis, a directional lens for deflecting the radiation beams of the individual laser diodes, a redirection lens for compensating the deflection of the directional lens, and a subsequent collimation lens.

SUMMARY OF THE INVENTION

The invention provides for an optical arrangement for symmetrizing the beam of a scaleable number of laser diode bars that comprises micro-optic components that are comparably simple to produce, is accessible to a cost-effective miniaturization, and with which the losses in radiance accompanying the symmetrizing are as small as possible. In particular, an improvement of the radiance should be attained as compared to fiber-coupled laser diode bars.

According to one non-limiting aspect of the invention, there is provided an optical arrangement for symmetrizing beams which includes a plurality of laser diodes arranged next to one another. The plurality of laser diodes emit beams which are asymmetrical relative to a first direction and a second direction. The second direction is perpendicular to the first direction. A microcylinder lens optics is arranged in an inclined manner around an optical axis. The beams emitted by the laser diodes in the first direction are collimated and deflected with different angles and are separated thereby. A direction element is arranged downstream of the microcylinder lens optics. The direction element deflects a beam of each individual laser diode in the second direction, whereby each of these beams is deflected by a different angle in the second direction, in such a way that central points of the individual beams converge at a predetermined distance in the second direction. The direction element deflects a beam of the individual laser diode in the first direction in such a way that each of these beams converges at a predetermined distance in the first direction. A redirection element is arranged at a distance downstream of the direction element. The redirection element compensates for different angles of deflection of the beams which are sent through the direction element in a plane.

The plurality of laser diodes may be arranged at least one of one above the other and on a common plane. The plurality of laser diodes may be arranged in a fixed location. The plurality of laser diodes nay be arranged to form a laser diode stack. The optical axis may correspond to an assigned linear array of laser diodes. The microcylinder lens optics may comprise a plurality of microcylinder lenses. The microcylinder lens optics may have sufficient isoplanacy. The redirection element may compensate for different angles of deflection of the beams which are sent through the direction element in a plane defined by the second direction and the optical axis. The first direction may define an "y" axis, the second direction may define an "x" axis, and the optical axis defines a "z" axis. The redirection element may compensate for different angles of deflection of the beams which are sent through the direction element in a plane defined by an x-z plane.

The arrangement may further comprise at least one projection lens arranged between the direction element and the redirection element, whereby the at least one projection lens directs the beams in the second direction to a common focal spot. The arrangement may further comprise at least one optical fiber arranged at the common focal spot. The at least one optical fiber may comprise one of a plurality of optical fibers and a fiber bundle. The microcylinder lens optics may comprise a plurality of microcylinder lenses, at least one of the plurality comprising one of a gradient optical microcylinder lens, a spherical microcylinder lens, an aspherical microcylinder lens, and a Fresnel lens. The microcylinder lens optics may comprise a plurality of microcylinder lenses, each the plurality comprising at least one of a gradient optical microcylinder lens, a spherical microcylinder lens, a aspherical microcylinder lens, and a Fresnel lens. The direction element may comprise at least one of a doublet lens, a biconvex lens, and a planoconvex lens. The direction element may comprise spherical surfaces. The direction element may comprise aspherical surfaces.

The arrangement may further comprise an optical element arranged adjacent the direction element. The optical element may evenly deflect the beams in the second direction in such a way that the beams in first direction are separated from one another at a predetermined distance in the second direction. The optical element may comprise at least one of an array of blazed gratings, a prism stack, and a mirror stack. The optical element may deflect the beams in the second direction by sectioning the direction element and subsequently joining the sections such that they are displaced relative to one another in the second direction. The redirection element may comprise at least one of an array of blazed gratings, a prism stack, and a mirror stack.

The arrangement may further comprise a deflecting element arranged between the direction element and the redirection element. The deflecting element may be arranged adjacent the redirection element, whereby the deflecting element deflects beams in the first direction in such a way that they leave the redirection element parallel to the optical axis. The deflecting element may comprise at least one of an array of blazed gratings, a prism stack, and a mirror stack. The deflecting element may comprise a diffraction element. The redirection element may comprise a diffraction element.

The arrangement may further comprise a lens located between the direction element and the redirection element, whereby the lens causes a collimation of individual beams in the second direction. The lens may be located adjacent the redirection element and may comprise at least one of a doublet lens, a biconvex lens, and a planoconvex lens. The direction element may comprise spherical surfaces. The direction element may comprise aspherical surfaces.

The arrangement may further comprise a focusing lens arranged downstream of the redirection element, whereby the focusing lens focuses the beams into one or more focus spots or points. The focusing lens may comprise at least one of an achromate lens, an achromate and a meniscus lens, a planoconvex lens, a planoconvex lens, a meniscus lens, and a biconvex lens. The focusing lens may comprise a spherical profile form. The focusing lens may comprise an aspherical profile form.

The invention may also provide for an optical arrangement for symmetrizing beams comprising a plurality of laser diodes arranged to form an array. A plurality of microcylinder lenses is arranged adjacent the array. A direction element is arranged downstream of the plurality of microcylinder lenses. The direction element deflects some beams in an "x" direction, whereby each of these beams is deflected by a different angle in the "x" direction, in such a way that central points of individual beams converge at a predetermined distance in the "x" direction. The direction element deflects some beams in a "y" direction in such a way that each of these beams converges at a predetermined distance in the "y" direction. A redirection element is arranged at a distance downstream the direction element. The redirection element compensates for different angles of deflection of the beams which are sent through the direction element.

The invention can also provide for an optical arrangement for symmetrizing beams comprising a plurality of laser diodes arranged to form an array. A plurality of microcylinder lenses is arranged adjacent the array. A direction element is arranged downstream of the microcylinder lenses. The direction element deflects some beams in a second direction, whereby each of these beams is deflected by a different angle in the second direction, in such a way that central points of individual beams converge at a predetermined distance in the second direction. The direction element deflects some beams in the first direction in such a way that each of these beams converges at a predetermined distance in the first direction. A redirection element is arranged at a distance downstream the direction element. At least one lens is arranged adjacent the redirection element. At least one optical fiber is arranged downstream the redirection element and the at least one lens. At least some of the beams exiting the redirection element are directed to a common focal spot on the at least one optical fiber.

Using a microcylinder lens that is assigned to each individual bar and inclined to its optical axis (z-axis), the beams emitted by the individual emitter of each bar in the direction of the stack of the laser diode bars is collimated, differently deflected, and thus separated. This deflection occurs such that the centers of the beams of individual emitters of different bars lying above one another impact a redirection element at the same height in this direction at a predetermined distance. A direction element located downstream from the microcylinder lenses causes a deflection of the beams of the individual emitters of a bar in the direction of the linear arrangement of the individual emitter such that the beam centers of the emitters of one bar occur at a predetermined distance on the redirection element in this direction. Moreover, the direction element deflects the beam centers of the individual bars in the direction of the stack such that all centers in the stack direction also fall on the redirection element. The redirection element deflects the emission beams originating from the individual emitters such that the deflection angles produced by the direction element are compensated again. A projection lens adjacent to the redirection element projects the beams of each bar in a focal spot, located at a predetermined distance. These focal spots are coupled into the face surfaces positioned there of the spread fibers of an optical fiber bundle. This bundle causes the focal spots, which were originally arranged one above the other in the direction of the stacking of the bars, to be rearranged into the desired symmetrical total focal spot.

By way of the multiple use of the direction and redirection element and the projection lens for all bars, the arrangement thus described allows a simple and cost-effective symmetrizing of the radiation from laser diode stacks while maintaining the radiance of the individual emitters to the greatest extent possible.

BRIEF DESCRIPTION OF THE DRAWINGS

An exemplary embodiment of the present invention is shown in the drawings and is explained in greater detail in the description below, in which:

FIGS. 3a–5a show, from an X-Z orientation, various embodiments of the optical arrangement for symmetrizing the beams of a two-dimensional array of laser diodes using additional deflecting elements; and FIGS. 3b–5b show, from an Y-Z orientation, various embodiments of the optical arrangement for symmetrizing the beams of a two-dimensional array of laser diodes using additional deflecting elements.

DETAILED DESCRIPTION OF THE INVENTION

Figure 1:
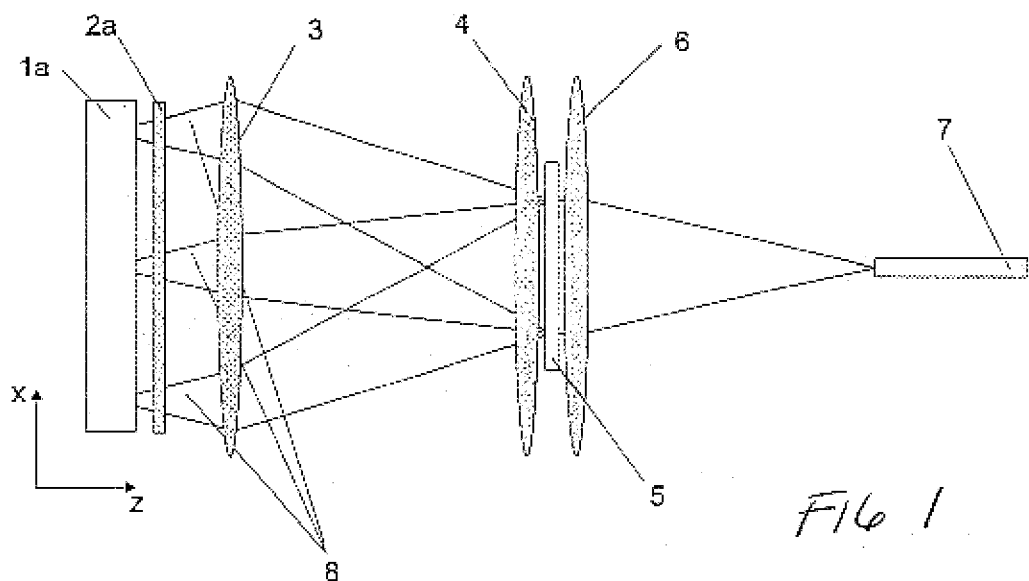
FIG. 1 shows, from an X-Z orientation, the optical arrangement for symmetrizing the beams of a two-dimensional array of laser diodes using a fiber bundle.
Figure 2:
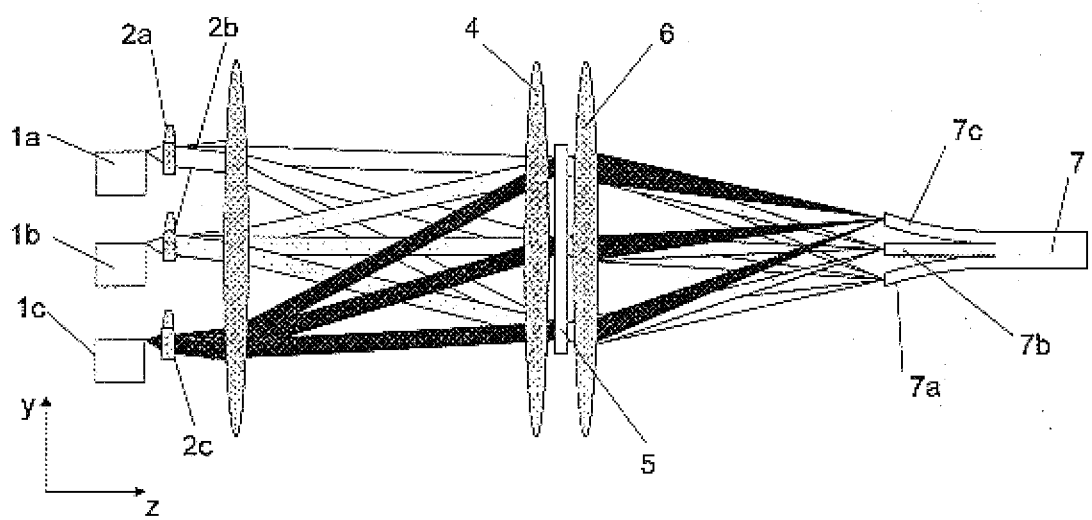
FIG. 2 shows, from an Y-Z orientation, the optical arrangement for symmetrizing the beams of a two-dimensional array of laser diodes using a fiber bundle.
Figure 3A:
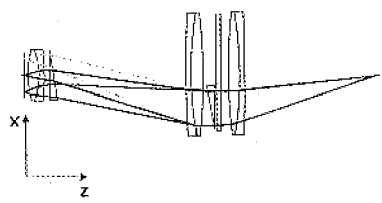
Figure 4A:
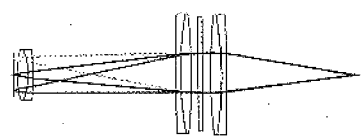
Figure 5A:
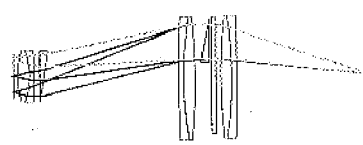
Figure 3B:
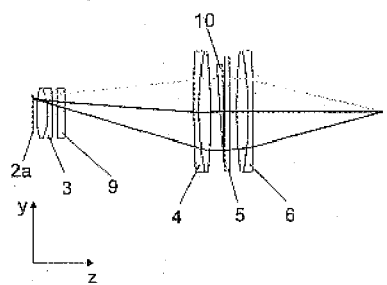
Figure 4B:
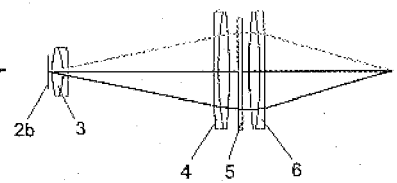
Figure 5B:
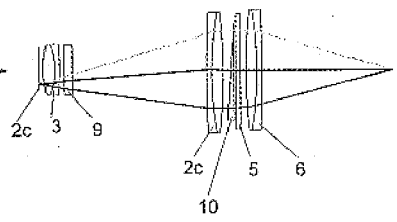

In the optical arrangement shown in FIGS. 1 and 2, reference numbers 1a, 1b, 1c indicate three laser diode bars stacked in the y direction, where the limitation to (i.e., illustration of) three bars 1a, 1b, 1c is solely for the purpose of an improved depiction. Each of these bars 1a, 1b, 1c comprises a plurality of individual emitters arranged in the x direction; for the sake of simplicity, only the two outer emitters and the center emitter are shown here. The divergence of the beams of each emitter is relatively large in the y-z plane (fast axis), the half angle of beam spread is 30° or greater. In the x-z plane (slow axis), on the other hand, the divergence of the beams of each emitter is comparatively low. Here, the half angle of beam spread is typically approximately 6°. The total extension of the bars 1a, 1b, 1c in the slow axis is typically 10 mm. The stack distance of the bars 1a, 1b, 1c from one another is in the range of approximately 0.1 to several millimeters.

A microcylinder lens 2a, 2b, 2c is assigned downstream of each of the individual bars 1a, 1b, 1c. In the path of the beams, a direction element 3 and a lens 4, a redirection element 5 and another lens 6 as well as optical fibers 7a, 7b, 7c joined into an optical cable bundle 7 follow in the sequence.

The microcylinder lenses 2a, 2b, 2c, which are inclined relative to the z axis, collimate the beams of the individual emitters of different bars 1a, 1b, 1c arranged one above the other and deflect the beam of the individual emitters, indicated in the drawings by 8, on the same height to the redirection element 5 such that the beams 8 of the emitter of a bar 1a, 1b, 1c are separated. Preferably, gradient optical cylinder lenses or multi-component cylinder lenses with sufficient isoplanacy are used as microcylinder lenses 2a, 2b, 2c. Typical focal lengths of the microcylinder lenses 2a, 2b, 2c lie in the range of 100 $\mu$m to approximately 1 mm.

The direction element 3 causes a deflection of the individual beams 8 of the emitters in the slow axis and a similar deflection of the beams of all emitters of each individual bar in the fast axis such that the beams 8 of the emitters of a bar 1a, 1b, 1c meet at the same x position and the central points of the beams of each bar meet at the same y position on the redirection element 5.

Plano-convex or biconvex lenses or doublets, preferably with a large field angle, with spherical or aspherical surfaces may be used as the direction element 3

Another possible implementation provides for combinations of these directional lenses 3 with prism arrays 9 according to FIGS. 3a–5b, which cause a displacement of the beams 8 of the individual bars 1a, 1b, 1c on the redirection element 5 in the slow axis. Here, a prism 9a, 9b, 9c (not shown) is provided that deflects in the slow axis and is assigned to each bar 1a, 1b, 1c. By way of the separation of the central points of the beams of the individual bars 1a, 1b, 1c on the redirection element 5 thus achieved, a position of the focal spots for each bar 1a, 1b, 1c in the y direction can be individually achieved, provided that the redirection element 5 is appropriately constructed, for example, the individual focal spots can also be positioned precisely on top of one another. Alternately, the combination of the direction lens 3 and the prism array 9 can be achieved by a dismantling of the direction lens 3 into several segments arranged in the slow axis displaced relative to one another. The focal lengths of the direction element 3 typically lie in the range of several mm to several 10 mm.

The redirection element 5 and the projection lens 4, 6 are located downstream of the direction element 3 (see FIG. 1).

In the concrete implementation, the lens 4, whose focal length corresponds to the focal length of the director, follows first. This first lens 4 of the projection lens causes a collimation of the beam bundles of the individual emitters in the slow axis. This allows an almost aberration-free operation of the redirection element 5. The embodiment options for the first lens 4 of the projection lens correspond to the variants for the direction element 3.

The redirection element 5 comprises a number of elements stacked in the fast axis with a deflecting effect in the slow axis, for example, an array of blazed gratings, a stack of prisms, or a mirror array. After the redirection element 5, a collimated beam is obtained from each bar 1a, 1b, 1c with a right-angle or square cross-section. The beam direction of this collimated beam from the redirection element 5 in the fast axis is different for each bar 1a, 1b, 1c.

If a separation of the beams 8 of the individual bars 1a, 1b, 1c is attained on the redirection element 5 in the slow axis by way of a combination of the direction lens 3 and the prism arrays 9 as in FIGS. 3a–b and 5a–b, these different beam directions can be compensated by appropriate elements 10 in the vicinity of the redirection element 5 that deflect in the fast and slow axes. These elements 10 may be implemented using, for example, additional prisms in the vicinity of the redirection element 5, using an appropriate construction of the redirection element 5, for example, as an array of two-dimensional deflecting blazed grating, or a combination of these elements. Thus, after the redirection element 5, an extensively symmetrical, collimated beam with a high radiance is present. For applications in which a collimated beam with a right-angular cross-section is needed, the second lens 6 of the projection lens, which would otherwise follow here, may be omitted.

Conventionally, however, a focused exiting beam is needed. The subsequent lens 6 forms images of the individual emitters of the respective bar 1a, 1b, 1c into one common focal spot.

Shown in FIG. 2 are the focal planes of the optic fibers 7a, 7b, 7c assigned to the lens 6, into which the overlapping images of the emitters of each bar 1a, 1b, 1c are coupled. By combining the optic cables 7a, 7b, 7c into a fiber bundle 7, the desired symmetrical bundle cross-section with the greatest maintenance of radiance is attained.

If, as shown in FIGS. 3a–b and 5a–b, the variant of the combination of the director lens 3 and the redirector 5, each with a prism array 9 or 10, is realized, a common focal spot is achieved for all bars 1a, 1b, 1c in the focal plane of the lens 6. Thus, a spread fiber bundle for combining the focal spots of the individual bars 1a, 1b, 1c is not necessary in this implementation.

What is claimed is:

1. An optical arrangement for symmetrizing beams comprising:

a plurality of laser diodes arranged adjacent to one another;

the plurality of laser diodes emitting beams which are asymmetrical relative to a first direction and a second direction, the second direction being perpendicular to the first direction;

a microcylinder lens optics arranged in an inclined manner about an optical axis, whereby the beams emitted by the laser diodes in the first direction are collimated and deflected with different angles to be separated;

a direction element arranged downstream of the microcylinder lens optics, the direction element deflecting a beam of each individual laser diode in the second direction, whereby each of the beams is deflected at a different angle in the second direction, so that central points of the individual beams converge at a predetermined distance in the second direction, the direction element deflecting a beam of each individual laser diode in the first direction such that each of the beams converges at a predetermined distance in the first direction; and a redirection element arranged at a predetermined distance downstream of the direction element, wherein the redirection element compensates for different angles of deflection of the beams which are transmitted through the direction element in a plane.

2. The arrangement of claim 1, wherein the plurality of laser diodes are arranged at least one of one above the other and on a common plane.

3. The arrangement of claim 1, wherein the plurality of laser diodes are arranged in a fixed location.

4. The arrangement of claim 1, wherein the plurality of laser diodes are arranged to form a laser diode stack.

5. The arrangement of claim 1, wherein the optical axis corresponds to an assigned linear array of laser diodes.

6. The arrangement of claim 1, wherein the microcylinder lens optics comprises a plurality of microcylinder lenses.

7. The arrangement of claim 1, wherein the microcylinder lens optics has sufficient isoplanacy.

8. The arrangement of claim 1, wherein the redirection element compensates for different angles of deflection of the beams transmitted through the direction element in a plane defined by the second direction and the optical axis.

9. The arrangement of claim 1, wherein the first direction defines an "y" axis, wherein the second direction defines a "x" axis, and wherein the optical axis defines a "z" axis.

10. The arrangement of claim 9, wherein the redirection element compensates for different angles of deflection of the beams which are transmitted through the direction element in a plane defined by an x-z plane.

11. The arrangement of claim 1, further comprising at least one projection lens arranged between the direction element and the redirection element, whereby the at least one projection lens directs the beams deflected in the second direction to a common focal spot.

12. The arrangement of claim 11, further comprising at least one optical fiber arranged at the common focal spot.

13. The arrangement of claim 12, wherein the at least one optical fiber comprises one of a plurality of optical fibers and a fiber bundle.

14. The arrangement of claim 1, wherein the microcylinder lens optics comprises a plurality of microcylinder lenses, at least one of the plurality comprising one of a gradient optical microcylinder lens, a spherical microcylinder lens, a aspherical microcylinder lens, and a Fresnel lens.

15. The arrangement of claim 1, wherein the microcylinder lens optics comprises a plurality of microcylinder lenses, each the plurality comprising at least one of a gradient optical microcylinder lens, a spherical microcylinder lens, a aspherical microcylinder lens, and a Fresnel lens.

16. The arrangement of claim 1, wherein the direction element comprises at least one of a doublet lens, a biconvex lens, a planoconvex lens.

17. The arrangement of claim 16, wherein the direction element comprises spherical surfaces.

18. The arrangement of claim 16, wherein the direction element comprises aspherical surfaces.

19. The arrangement of claim 1, further comprising an optical element arranged adjacnt the direction element.

20. The arrangement of claim 19, wherein the optical element evenly deflects the beams in the second direction.

21. The arrangement of claim 19, wherein the optical element comprise at least one of blazed gratings, a prism stack, and a mirror stack.

22. The arrangement of claim 19, wherein the optical element is sectioned and deflects the beams in the second direction.

23. The arrangement of claim 1, wherein the redirection element comprises at least one of an array of blazed gratings, a prism stack, and a mirror stack.

24. The arrangement of claim 1, further comprising an deflecting element arranged between the direction element and the redirection element.

25. The arrangement of claim 24, wherein the deflecting element is arranged adjacent the redirection element, whereby the deflecting element deflects beams in the first direction such that they are emitted from the redirection element parallel to the optical axis.

26. The arrangement of claim 24, wherein the deflecting element comprises at least one of an array of blazed gratings, a prism stack, and a mirror stack.

27. The arrangement of claim 24, wherein the deflecting element comprises a diffraction element.

28. The arrangement of claim 1, wherein the redirection element comprises a diffraction element.

29. The arrangement of claim 1, further comprising a lens located between the direction element and the redirection element, whereby the lens causes a collimation of individual beams in the second direction.

30. The arrangement of claim 29, wherein the lens is located adjacent the redirection element and comprises at least one of a doublet lens, a biconvex lens, and a planoconvex lens.

31. The arrangement of claim 30, wherein the direction element comprises spherical surfaces.

32. The arrangement of claim 30, wherein the direction element comprises aspherical surfaces.

33. The arrangement of claim 1, further comprising a focusing lens arranged downstream of the redirection element, whereby the focusing lens focuses the beams into at least one focus spot.

34. The arrangement of claim 33, wherein the focusing lens comprises at least one of an achromate lens, an achromate and a meniscus lens, a planoconvex lens, a planoconvex lens, a meniscus lens, and a biconvex lens.

35. The arrangement of claim 34, wherein the focusing lens comprises a spherical profile form.

36. The arrangement of claim 34, wherein the focusing lens comprises an aspherical profile form.

37. An optical arrangement for symmetrizing beams comprising:

a plurality of laser diodes emitting beams and arranged to form an array;

a plurality of microcylinder lenses adjacent the array;

a direction element arranged downstream of the plurality of microcylinder lenses;

the direction element deflecting some beams in a first direction, whereby each of the beams is deflected by a different angle in the first direction, such that central points of individual beams converge at a predetermined distance in the first direction;

the direction element deflecting some beams in a second direction such that each of the beams converges at a predetermined distance in the second direction; and a redirection element arranged at a distance downstream the direction element, wherein the redirection element compensates for different angles of deflection of the beams transmitted through the direction element.

38. An optical arrangement for symmetrizing beams comprising:
- a plurality of laser diodes emitting beams and arranged to form an array;
- a plurality of microcylinder lenses adjacent the array;
- a direction element arranged downstream of the microcylinder lenses;
- the direction element deflecting some beams in a first direction, whereby each of the beams is deflected by a different angle in the first direction, such that central points of individual beams converge at a predetermined distance in the first direction;
- the direction element deflecting some beams in a second direction such that each of the beams converges at a predetermined distance in the second direction;
- a redirection element arranged at a distance downstream of the direction element;
- at least one lens arranged adjacent the redirection element; and
- at least one optical fiber arranged downstream the redirection element and the at least one lens,
- wherein at least some of the beams exiting the redirection element are directed to a common focal spot on the at least one optical fiber.

* * * * *